(12) United States Patent
Singireddy et al.

(10) Patent No.: US 9,166,409 B2
(45) Date of Patent: Oct. 20, 2015

(54) SYSTEM AND METHOD TO PERFORM AUTOMATIC PHASE REVERSAL DETECTION

(75) Inventors: Shailender Singireddy, Andhra Pradesh (IN); Sridhar Nedunsezian, Tamilnadu (IN); Balakrishna Pamulaparthy, Andhra Pradesh (IN)

(73) Assignee: General Electric Company, Schenectady, NY (US)

( * ) Notice: Subject to any disclaimer, the term of this patent is extended or adjusted under 35 U.S.C. 154(b) by 691 days.

(21) Appl. No.: 13/534,120

(22) Filed: Jun. 27, 2012

(65) Prior Publication Data
US 2014/0001886 A1 Jan. 2, 2014

(51) Int. Cl.
*H01H 35/00* (2006.01)
*H02J 3/24* (2006.01)
*H02J 3/08* (2006.01)
*H02J 3/26* (2006.01)
*G01R 29/18* (2006.01)

(52) U.S. Cl.
CPC . *H02J 3/24* (2013.01); *G01R 29/18* (2013.01); *H02J 3/08* (2013.01); *H02J 3/26* (2013.01); *Y10T 307/839* (2015.04)

(58) Field of Classification Search
CPC .................. H02J 3/08; H02J 3/24; H02J 3/26
USPC ............................................ 307/127; 361/77
See application file for complete search history.

(56) References Cited

U.S. PATENT DOCUMENTS

| 5,267,117 A | * | 11/1993 | Moore ............................ 361/77 |
| 5,761,073 A | | 6/1998 | Dickson |
| 6,642,700 B2 | | 11/2003 | Slade et al. |
| 2009/0055031 A1 | | 2/2009 | Slota et al. |

* cited by examiner

*Primary Examiner* — Carlos Amaya
(74) *Attorney, Agent, or Firm* — GE Global Patent Operation

(57) ABSTRACT

A system and method to perform automatic phase reversal detection are described. The system includes a first subsystem and a second subsystem configured to be synchronized with the first subsystem. A controller is configured to receive a first input from the first subsystem or the second subsystem and a second input from the first subsystem or the second subsystem and perform phase reversal detection based on the first input and the second input.

13 Claims, 2 Drawing Sheets

SYSTEM AND METHOD TO PERFORM AUTOMATIC PHASE REVERSAL DETECTION

BACKGROUND OF THE INVENTION

The subject matter disclosed herein relates to synchronizing two power supplies by matching their electrical parameters.

In a power plant, for example, the generator must be synchronized with the electrical grid before operating breakers to physically connect the generator to the grid. Specifically, four parameters—voltage, frequency, phase difference, and phase sequence—must match between the two sides for successful synchronization. The controller making a determination of when to close the breaker to connect the generator to the grid will see a mismatch when the potential transformers on the generator side and the potential transformer on the grid side are not wired consistently at the controller. Because the controller assumes that the wiring is correct, any mismatch will lead the controller to instruct the turbine governor to increase the speed in order to bring the phase difference to zero. Thus, when a phase difference is the result of wiring error rather than a mismatch of parameters, the controller can cause severe damage to plant systems including the generator, breaker, and transformer.

BRIEF DESCRIPTION OF THE INVENTION

According to one aspect of the invention, a system to perform automatic phase reversal detection includes a first subsystem; a second subsystem configured to be synchronized with the first subsystem; and a controller configured to receive a first input from the first subsystem or the second subsystem and a second input from the first subsystem or the second subsystem and perform phase reversal detection based on the first input and the second input.

According to another aspect of the invention, a method to perform automatic phase reversal detection in a system including a first subsystem and a second subsystem to be synchronized with the first subsystem includes arranging a controller to receive a first input from the first subsystem or the second subsystem and a second input from the first subsystem or the second subsystem; and the controller performing phase reversal detection based on the first input and the second input.

According to yet another aspect of the invention, a computer-readable medium storing instructions which, when processed by a processor, cause the processor to perform a method of automatically detecting phase reversal between a first input and a second input to determine a status of a synchronization between a first subsystem and a second subsystem. The method includes controlling one or more breakers between the first subsystem and the second subsystem to cause only one of the first subsystem and the second subsystem to supply both the first input and the second input; determining a phase difference between the first input and the second input; and detecting phase reversal between the first input and the second input based on the phase difference, wherein no phase reversal is detected between the first input and the second input when the phase difference is zero.

These and other advantages and features will become more apparent from the following description taken in conjunction with the drawings.

BRIEF DESCRIPTION OF THE DRAWING

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Embodiments of the present invention are explained with reference to a power plant system. However, it is to be understood that the various embodiments are not limited to the exemplary system but, instead, contemplated for use in any system that would benefit from automatic detection of phase reversal.

Figure 1:
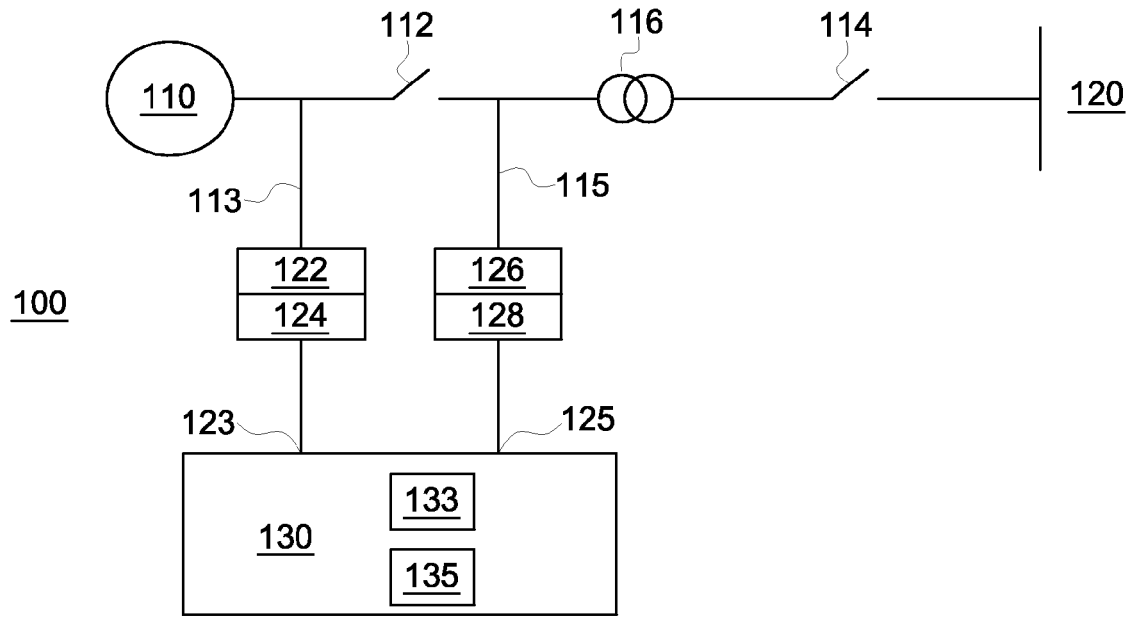
FIG. 1 is block diagram of aspects of a first power plant configuration according to an embodiment of the present invention.

FIG. 1 is block diagram of aspects of a first power plant configuration 100 according to an embodiment of the present invention. As shown, the power plant includes a generator 110 that supplies power to a grid 120 through a series of breakers 112, 114 and a generator step-up (GSU) transformer 116. In addition, a turbine control system (TCS) 130 acts as a controller that checks the phase matching between the two sides and controls the breakers 112, 114 to close only after achieving a phase match. The TCS 130 draws inputs through the first primary and secondary potential transformers 122 and 124, respectively, and the second primary and secondary potential transformers 126 and 128, respectively. Although three-phase power (RYB) flows in lines 113, 115 and out of the secondary potential transformers 124 and 128, two phases (RY) are inputs 123, 125 at the TCS 130. Thus, a wiring error at the TCS 130 may mean that input 123 is RY while input 125 is YR, for example. In this case, inputs 123 and 125 are 180 degrees out of phase with each other.

The TCS 130 according to an embodiment of the present invention performs an automatic check of the wiring of inputs 123 and 125. The following procedures of the automatic check, the phase detection sequence, are stored in a memory device 133. The phase detection sequence carried out by the TCS 130 begins with the TCS 130 issuing a command to open breaker 114. The turbine is started to develop full terminal voltage at the generator 110. Then the breaker 112 is closed. At this point, with breaker 112 closed and breaker 114 open, both inputs 123 and 125 are fed by the generator 110. Thus, the phase difference between the inputs 123 and 125 should be zero. That is, based on the positions of the breakers 112, 114 set by the TCS 130, any non-zero phase difference (usually 180 degrees) between the inputs 123, 125 indicates a phase reversal between the inputs 123 and 125. The TCS 130 may issue an alert through an output device 135 and inhibit synchronization attempts when it detects a phase reversal during the test. In this and other embodiments, the TCS 130 may include one or more processors and one or more memory devices, like memory device 133.

Figure 2:
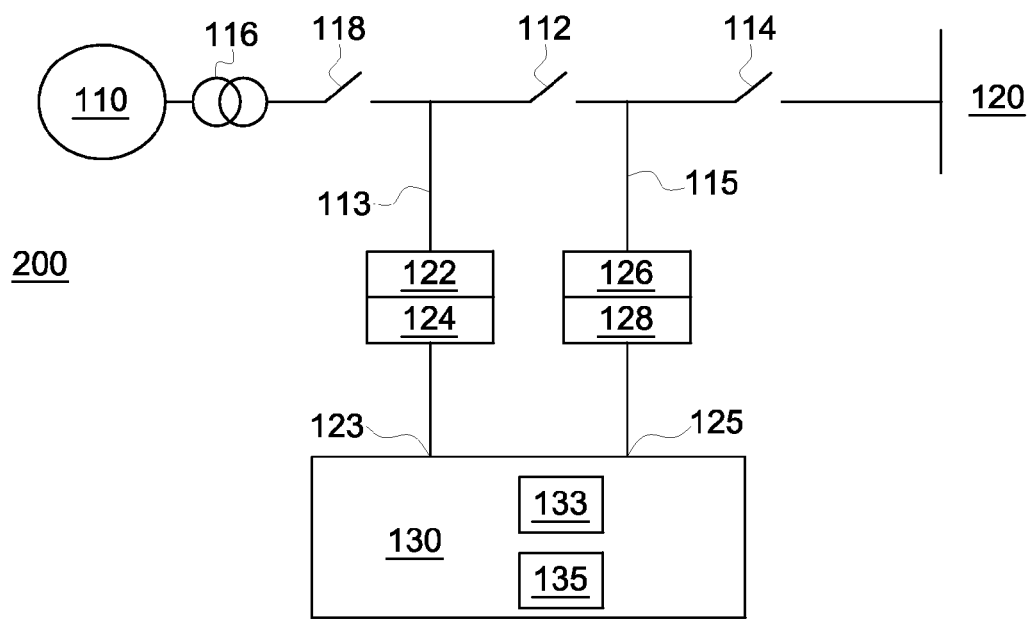
FIG. 2 is block diagram of aspects of a second power plant configuration according to an embodiment of the present invention.

FIG. 2 is block diagram of aspects of a second power plant configuration 200 according to an embodiment of the present invention. While FIG. 1 and FIG. 2 show two exemplary configurations 100, 200, they are not to be understood as limiting embodiments of the invention in any way. Based on the configuration 200 of FIG. 2, a different or additional phase detection sequence may be stored in memory device 133. In the phase detection sequence associated with the configuration 200 relating to FIG. 2, TCS 130 issues a command to open both breakers 112 and 114. The TCS 130 then issues a command to open the isolator 118. Once the isolator 118 is open, the TCS 130 issues commands to close the breakers 112 and 114 in turn. At this point, both inputs 123 and 125 originate from the grid 120. As a result, the phase difference at the inputs 123, 125 should be zero unless the wiring is inconsistent between the two sides. The TCS 130 may issue an alert through the output device 135 and inhibit synchronization when it detects a phase reversal during the test. The output may be as simple as Bit 1 when there is no phase difference, as expected, and Bit 0 when there is a phase difference. In an alternative embodiment, the output may be a message that includes an alert to check the wiring.

Exemplary configurations 100, 200 shown at FIG. 1 and FIG. 2 and other configurations used in power plants are known to the TCS 130. In one embodiment, the TCS 130 in a given plant is programmed with the phase detection sequence that matches the configuration of that plant. That is, the memory device 133 stores the relevant sequence of commands. In an alternate embodiment, the TCS 130 stores all the sequences associated with all the possible configurations in memory device 133. A preset selection (set at the time of installation in a given power plant) or user input could determine which sequence is used by a given TCS 130.

Figure 3:
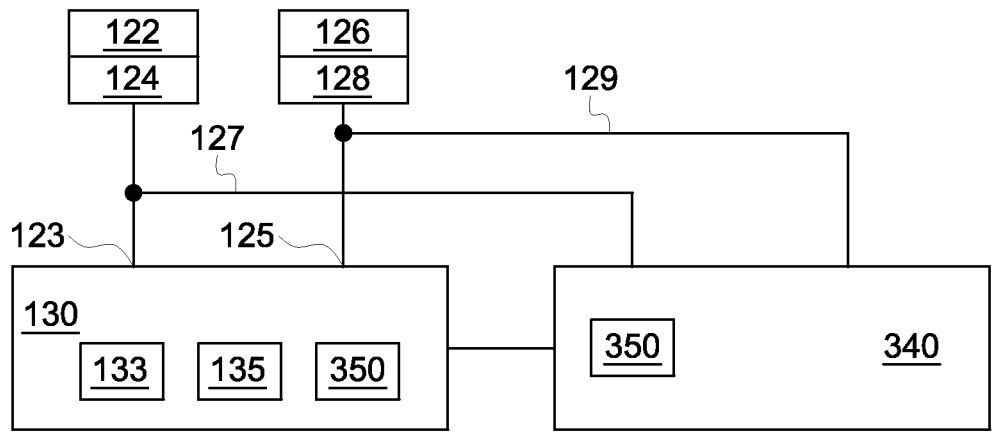
FIG. 3 is a block diagram illustrating aspects of a power plant according to an embodiment of the present invention.

FIG. 3 is a block diagram illustrating aspects of a power plant according to an embodiment of the present invention. As a practical matter, after the initial installation of plant systems, wiring at the inputs 123 and 125 is more likely to be undone for maintenance and then reattached. Also, under certain conditions, the outputs of the secondary potential transformers 124 and 128 may be re-wired during maintenance, as well. The undoing of wiring in the lines 113 and 115 (FIG. 2) is a rarer event. The embodiments discussed above address the automatic phase detection at the inputs 123 and 125, the most likely source of inconsistent wiring. The present embodiment ensures that the wiring out of the secondary potential transformers 124, 128 is correct, as well.

As noted above, outputs from the secondary potential transformers 124 and 128 are in three-phases. While the TCS 130 does not receive all three phases, the electrical protection relay (EPR) 340 receives the three-phase output of the secondary potential transformers 124 and 128. The EPR 340 performs the phase detection based on an algorithm stored in memory 350 to measure and compare the phase sequence between lines 127 and 129 (outputs of the secondary potential transformers 124 and 128). The EPR 340 indicates to the TCS 130 whether the phase sequence of line 127 matches that of line 129. In one embodiment, the EPR 340 may use a status bit for the indication, for example. That is, the EPR 340 may output Bit 1 when the phase sequence of both lines 127, 129 matches and may output Bit 0 when it does not match. In this embodiment, the status bit is passed from the EPR 340 to the TCS 130 through the IEC 61850 Digital GOOSE message standard in a peer-to-peer manner, within 4 ms. The status bit from the EPR 340 is used by the TCS 130 to determine if synchronization is permitted between the generator 110 and grid 120.

In one embodiment, the test conducted on the outputs of the secondary potential transformers 124 and 128 may be a second tier of testing. That is, if the phase detection sequence discussed with regard to FIGS. 1 and 2 indicates a phase reversal, the processes described above may be conducted first to indicate, via the output device 135, which side (TCS 130 side or secondary potential transformer 124, 128 side) wiring requires correction.

In an alternate embodiment to the ones described with reference to FIGS. 1 and 2, the EPR 340 can be used to check wiring integrity at the TCS 130 when both EPR and TCS are time synchronized. The Analog GOOSE message from the EPR 340 to the TCS 130 includes voltage magnitude and phase angle measured at a specified timestamp. The EPR 340 measures a voltage sample through the line 127 and sends it to the TCS 130 using an IEC 61850 Analog GOOSE message. When the TCS 130 receives the Analog GOOSE message from the ERP 340 and compares the voltage and phase angle included in the message with voltage and phase angle measured at the TCS 130 at input 123 at the same timestamp, the TCS 130 determines the phase difference error component. The phase difference (first phase difference) should be zero. A non-zero phase difference indicates a wiring mismatch between the secondary potential transformer 124 and the input 123 at TCS 130. The EPR 340 also measures a voltage sample through the line 129 and sends it to the TCS 130 using an IEC 61850 Analog GOOSE message. When the TCS 130 compares the voltage and phase angle included in the message with voltage and phase angle measured at the TCS 130 at input 125, the phase difference (second phase difference) should also be zero. A non-zero phase difference indicates a wiring mismatch between the secondary potential transformer 128 and the input 125 at TCS 130. Additionally, if the first phase difference does not match the second phase, then the TCS 130 indicates a wiring error between the two inputs 123, 125.

Figure 4:
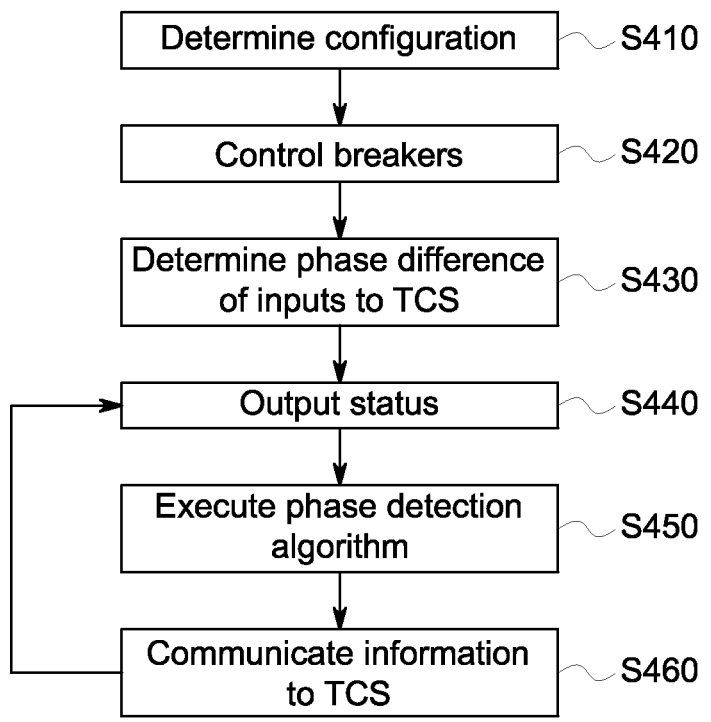
FIG. 4 illustrates the processes involved in performing automatic phase reversal detection according to an embodiment of the present invention.

FIG. 4 illustrates the processes that have a technical effect of performing automatic phase reversal detection according to one or more embodiments of the present invention. At block S410, determining the configuration refers to determining the configuration of the power plant and, specifically, the sequence of breakers to connect the generator 110 to the grid 120. The determination may be made for a TCS 130 prior to its installation in a power plant based on the configuration (e.g., 100, 200) of the power plant for which it is destined. In alternate embodiments, determining the configuration can include a user input on-site or a pre-setting on-site. At block S420, controlling the breakers (e.g., 112, 114, 118) is done by the TCS 130. Based on the configuration (e.g. 100, 200) of the power plant, the TCS 130 controls the breakers (e.g., 112, 114, 118) to ensure that both inputs 123, 125 are from the same source (either the generator 110 or the grid 120). At block S430, determining the phase difference between the inputs 123, 125 by the TCS 130 allows the TCS 130 to determine if there is a wiring error (phase difference is non-zero) or if there is no wiring error (phase difference is zero) at the inputs 123, 125. The determining may be done with the aid of the ERP 340 as discussed above. At S440, outputting the status includes the TCS 130 indicating whether synchronization between the generator 110 and the grid 120 should proceed.

When the TCS 130 indicates that the inputs 123 and 125 have a non-zero phase difference based on the test sequence described above, it indicates a wiring error at inputs 123, 125 or at outputs of the secondary potential transformers 124, 128. At block S450, executing the phase detection algorithm includes the ERP 340 using the device-specific known phase detection algorithm to measure and compare the phase sequence of the lines 127, 129. At block S460, the ERP 340 communicating information to the TCS 130 includes the ERP 340 conveying information to indicate a match or non-match between the phase sequence of line 127 with the phase sequence of line 129. This communicating may be by IEC 61850 Digital GOOSE message in a peer-to-peer manner, within 4 ms. Through the processes described above, a wiring error may not only be detected but also isolated, because if the ERP 340 indicates that the phase sequence of lines 127 and 129 match, for example, then a wiring error is likely at one or both inputs 123, 125.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A system to perform automatic phase reversal detection, the system comprising:
   a first subsystem;
   a second subsystem configured to be synchronized with the first subsystem; and
   a controller configured to receive a first input from the first subsystem or the second subsystem and a second input from the first subsystem or the second subsystem and perform phase reversal detection based on the first input and the second input;
   wherein a second controller indicates, to the controller, a first measurement for a first origin of the first input at a first time and a second measurement for a second origin of the second input at a second time; and
   wherein the controller performs a first comparison of the first measurement and a measurement for the first input at the first time and a second comparison of the second measurement and a measurement for the second input at the second time and performs the phase reversal detection based on the first comparison and the second comparison.

2. The system according to claim 1, wherein the controller outputs an alert when the phase reversal detection indicates a phase reversal in the system.

3. The system according to claim 1, wherein the controller controls one or more breakers between the first subsystem and the second subsystem in a sequence to cause the first input and the second input to both originate from the first subsystem or from the second subsystem and determines a phase difference between the first input and the second input, and the controller indicates there is no phase reversal in the system when the phase difference is zero.

4. The system according to claim 3, wherein a number and position of the one or more breakers is based on a configuration of the system, and the sequence is based on the number and the position of the one or more breakers.

5. The system according to claim 4, wherein the sequence is preset in the controller based on the configuration.

6. The system according to claim 4, wherein a user input is used to select the sequence in the controller.

7. The system according to claim 1, further comprising a second controller configured to compare a phase sequence of a first origin of the first input and a second origin of the second input and to indicate, to the controller, a result of the comparison as a status of phase reversal between the first origin and the second origin.

8. The system according to claim 7, wherein the second controller communicates the status to the controller via International Electrotechnical Commission's (IEC) 61850 Generic Object Oriented Substation Events (GOOSE) message.

9. A method to perform automatic phase reversal detection in a system including a first subsystem and a second subsystem to be synchronized with the first subsystem, the method comprising:
   arranging a controller to receive a first input from the first subsystem or the second subsystem and a second input from the first subsystem or the second subsystem; and
   the controller performing phase reversal detection based on the first input and the second input; and
   a second controller indicating, to the controller, a first measurement for a first origin of the first input at a first time and a second measurement for a second origin of the second input at a second time, wherein the performing phase reversal detection by the controller includes the controller performing a first comparison of the first measurement and a measurement for the first input at the first time and a second comparison of the second measurement and a measurement for the second input at the second time.

10. The method according to claim 9, further comprising the controller outputting an alert when the performing phase reversal detection indicates a phase reversal in the system.

11. The method according to claim 9, further comprising the controller controlling one or more breakers between the first subsystem and the second subsystem in a sequence to cause the first input and the second input to both originate from the first subsystem or from the second subsystem, wherein the performing phase reversal detection is based on a phase difference between the first input and the second input, a phase difference of zero indicating that there is no phase reversal in the system.

12. The method according to claim 9, further comprising a second controller comparing a phase sequence of a first origin of the first input and a second origin of the second input and determining a status of phase reversal between the first origin and the second origin based on the comparing, wherein the performing phase reversal detection includes receiving the status from the second controller.

13. The method according to claim 12, further comprising:
   the second controller communicating the status to the controller via International Electrotechnical Commission's (IEC) 61850 Generic Object Oriented Substation Events (GOOSE) message.

* * * * *

UNITED STATES PATENT AND TRADEMARK OFFICE
CERTIFICATE OF CORRECTION

| | | |
|---|---|---|
| PATENT NO. | : 9,166,409 B2 | Page 1 of 1 |
| APPLICATION NO. | : 13/534120 | |
| DATED | : October 20, 2015 | |
| INVENTOR(S) | : Singireddy et al. | |

It is certified that error appears in the above-identified patent and that said Letters Patent is hereby corrected as shown below:

Specification

In Column 4, Line 18, delete "ERP" and insert -- EPR --, therefor.

In Column 4, Line 58, delete "ERP" and insert -- EPR --, therefor.

In Column 4, Line 67, delete "ERP" and insert -- EPR --, therefor.

In Column 5, Line 2, delete "ERP" and insert -- EPR --, therefor.

In Column 5, Line 3, delete "ERP" and insert -- EPR --, therefor.

In Column 5, Line 10, delete "ERP" and insert -- EPR --, therefor.

Signed and Sealed this
Sixteenth Day of August, 2016

Michelle K. Lee
*Director of the United States Patent and Trademark Office*